United States Patent
Lee et al.

(10) Patent No.: US 7,129,488 B2
(45) Date of Patent: Oct. 31, 2006

(54) SURFACE-NORMAL OPTICAL PATH STRUCTURE FOR INFRARED PHOTODETECTION

(75) Inventors: Jong Jan Lee, Camas, WA (US); Jer-Shen Maa, Vancouver, WA (US); Douglas J. Tweet, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 243 days.

(21) Appl. No.: 10/746,952

(22) Filed: Dec. 23, 2003

(65) Prior Publication Data

US 2005/0133723 A1    Jun. 23, 2005

(51) Int. Cl.
*G01J 5/20* (2006.01)
*G01J 5/08* (2006.01)

(52) U.S. Cl. .................. 250/338.4; 438/65
(58) Field of Classification Search .......... 250/338.4; 438/65
See application file for complete search history.

(56) References Cited

U.S. PATENT DOCUMENTS

| | | | | |
|---|---|---|---|---|
| 5,239,179 | A * | 8/1993 | Baker ................... | 250/338.4 |
| 5,356,821 | A * | 10/1994 | Naruse et al. .......... | 438/234 |
| 6,307,242 | B1 * | 10/2001 | Sugiyama ............... | 257/432 |
| 6,451,702 | B1 * | 9/2002 | Yang et al. ............. | 438/706 |
| 2002/0171077 | A1 * | 11/2002 | Chu et al. .............. | 257/19 |
| 2005/0127275 | A1 * | 6/2005 | Yang .................... | 250/214 R |
| 2005/0153474 | A1 * | 7/2005 | Tweet et al. ........... | 438/69 |

OTHER PUBLICATIONS

C.K. Maiti, N.B. Chakrabarti and S.K. Ray, Strained Silicon Heterostructures: Materials and Devices, Chapter 10: Si/SiGe Optoelectronics, Published by The Institution of Electrical Engineer, 2001.
S. Murtaza et.al., "Room Temperature Electroabsorption in $Ge_xSi_{1-x}$ PIN Photodiode," IEEE Trans. on Electron Devices, 2297-2300, vol. 41, No. 12, 1994.
T. Tashiro et.al., "A Selective Epitaxial SiGe/Si Planar Photodetector for Si-Based OEIC's," IEEE Trans. on Electron Devices, 545-550, vol. 44, No. 4, 1997.

(Continued)

*Primary Examiner*—David Porta
*Assistant Examiner*—Shun Lee
(74) *Attorney, Agent, or Firm*—Law Office of Gerald Maliszewski; Gerald Maliszewski

(57) ABSTRACT

A SiGe surface-normal optical path photodetector structure and a method for forming the SiGe optical path normal structure are provided. The method comprises: forming a Si substrate with a surface; forming a Si feature, normal with respect to the Si substrate surface, such as a via, trench, or pillar; depositing SiGe overlying the Si normal feature to a thickness in the range of 5 to 1000 nanometers (nm); and, forming a SiGe optical path normal structure having an optical path length in the range of 0.1 to 10 microns. Typically, the SiGe has a Ge concentration in the range from 5 to 100%. The Ge concentration may be graded to increase with respect to the deposition thickness. For example, the SiGe may have a 20% concentration of Ge at the Si substrate interface, a 30% concentration of Ge at a SiGe film top surface, and a thickness of 400 nm.

22 Claims, 8 Drawing Sheets

OTHER PUBLICATIONS

A. Vonsovici et.al., "Room Temperature Photocurrent Spectroscopy of SiGe/Si p-i-n Photodieodes Grown by Selective Epitaxy," IEEE Trans. on Electron Devices, 538-542, vol. 45, No. 2, 1998.

R.E. Jones et.al., "Fabrication and Modeling of Gigahertz Photodetectors in Heteroepitaxial Ge-on-Si using Graded Buffer Layer Deposited by Low Energy Plasma Enhanced CVD," IEDM, 2002.

* cited by examiner

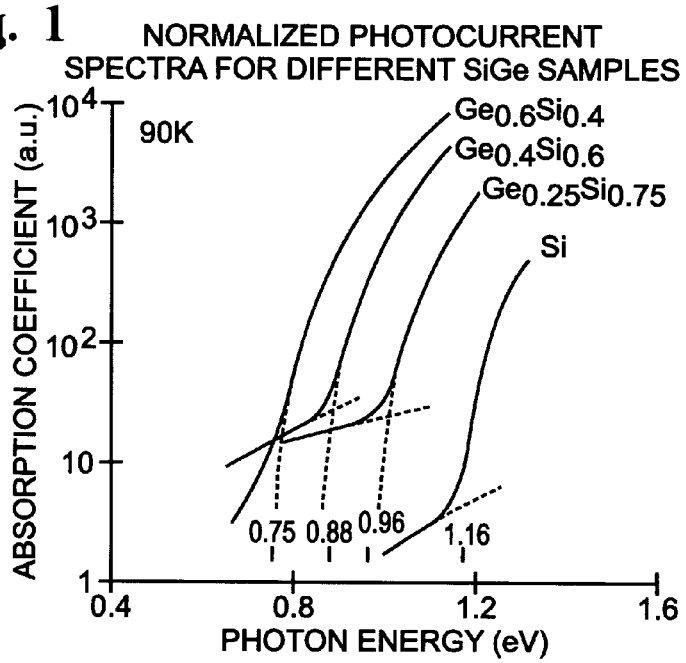
Fig. 1 NORMALIZED PHOTOCURRENT SPECTRA FOR DIFFERENT SiGe SAMPLES
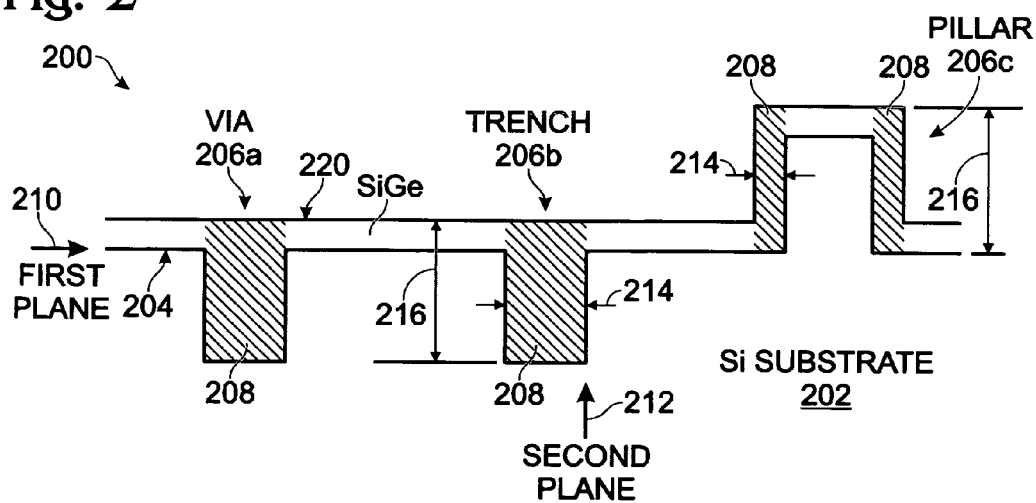
Fig. 2

PIN PHOTO DIODE

SURFACE-NORMAL OPTICAL PATH STRUCTURE FOR INFRARED PHOTODETECTION

BACKGROUND OF THE INVENTION

1. Field of the Invention

This invention generally relates to integrated circuit (IC) fabrication processes and, more particularly, to a surface-normal infrared optical path structure and corresponding fabrication method.

2. Description of the Related Art

There are many applications for photodetection in the near infrared region (the wavelength between 0.7 micron to 2 microns), such as in fiber-optical communication, security, and thermal imaging. Although III–V compound semiconductors provide superior optical performance over their silicon (Si)-based counterparts, the use of Si is desirable, as the compatibility of Si-based materials with conventional Si-IC technology promises the possibility of cheap, small, and highly integrated optical systems.

Silicon photodiodes are widely used as photodetectors in the visible light wavelengths due to their low dark current and the above-mentioned compatibility with Si IC technologies. Further, silicon-germanium ($Si_{1-x}Ge_x$) permits the photodetection of light in the 0.8 to 1.6 micron wavelength region.

However, the SiGe alloy has larger lattice constant than the Si lattice, so film thickness is a critical variable in the epitaxial growth of SiGe on Si substrates. While a thick SiGe is desirable for light absorption, too thick of a SiGe film causes a defect generation that is responsible for dark currents. This critical SiGe thickness is dependent upon the Ge concentration and device process temperature. Higher Ge concentrations and higher device process temperatures result in the formation of thinner SiGe film thicknesses. In common practice, the SiGe critical thickness is in the range of a few hundred angstroms, to maximum of a few thousand angstroms. Once the SiGe thickness is grown beyond its critical thickness, lattice defects in SiGe are inevitable. As mentioned above, an IR photo detector built from a SiGe film with lattice defects generates large dark currents and noise.

Quantum efficiency is a measure of the number of electron-hole pairs generated per incident photon, and it is a parameter for photodetector sensitivity. Quantum efficiency is defined as:

$$\eta = (I_p/q)/(P_{opt}/h\nu)$$

where $I_p$ is the current generated by the absorption of incident optical power $P_{opt}$ at the light frequency $\nu$.

FIG. 1 is a graph showing the relationship between quantum efficiency and the percentage of Ge in a SiGe film. One of the key factors in determining quantum efficiency is the absorption coefficient, $\alpha$. Silicon has a cutoff wavelength of about 1.1 microns and is transparent in the wavelength region between 1.3 to 1.6 microns. The SiGe absorption edge shifts to the red with an increasing Ge mole fraction and is shown in FIG. 1. The absorption coefficient of any SiGe alloy is relatively small and the limited thickness dictated by the critical thickness further limits the ability of SiGe films to absorb photons.

As noted above, the major goals of SiGe-based photodetection are high quantum efficiency and the integration of these SiGe photodetectors with the existing Si electronics. One way to increase the optical path, and improve the quantum efficiency, is to form the optical path in the same plane as the SiGe film, along the substrate surface in which the SiGe is deposited. Thus, light propagates parallel to the heterojunction (SiGe/Si) interface. However, this optical path design necessarily limits the design of IR detectors.

It would be advantageous if an efficient SiGe IR photodetector could be fabricated having an optical path that need not be formed in parallel with a Si substrate surface.

SUMMARY OF THE INVENTION

The present invention SiGe optical path structure (absorbs IR wavelength light that is normal to a silicon substrate surface and parallel to the SiGe/Si heterojunction interface, increasing the length of the optical path. Therefore, a two-dimensional IR image detection can be realized with a thin SiGe thickness. Because of the relatively poor quantum efficiencies associated with SiGe, the IR absorption length of SiGe must be long, and conventionally a thick SiGe layer is needed to absorb high amounts of IR energy. However, it is very difficult to grow defect-free thick SiGe film on Si substrate because of the lattice mismatch between these two materials. The present invention eliminates the need for a thick SiGe film. SiGe film is grown on the sidewall of a Si substrate trench or pillar, forming a relatively long optical path for light normal to the substrate surface. The present invention's use of relatively thin SiGe films permits a SiGe IR photodetector to be easily integrated with Si CMOS devices, with minimal lattice mismatch.

Accordingly, a method is provided for forming a SiGe optical path structure, normal to a Si substrate surface, for the purpose of IR photodetection. The method comprises: forming a Si substrate with a surface; forming a Si feature, normal with respect to the Si substrate surface, such as a via, trench, or pillar; depositing SiGe overlying the Si normal feature to a thickness in the range of 5 to 1000 nanometers (nm); and, forming a SiGe optical path normal structure having an optical path length in the range of 0.1 to 10 microns.

In some aspects of the method, depositing SiGe overlying the Si normal feature includes depositing SiGe with a Ge concentration in the range from 5 to 100%. In other aspects, the SiGe is deposited with a graded Ge concentration that increases with respect to the deposition thickness. For example, the SiGe may have a 20% concentration of Ge at the Si substrate interface, a 30% concentration of Ge at a SiGe film top surface, and a thickness of 400 nm.

Additional details of the above-described method and a SiGe optical path structure, normal to a Si substrate surface, are provided below.

BRIEF DESCRIPTION OF THE DRAWINGS

FIG. 1 is a graph showing the relationship between quantum efficiency and the percentage of Ge in a SiGe film.

FIG. 2 is a cross-sectional view of the present invention SiGe optical path structure, normal to a Si substrate surface, for IR photodetection.

DETAILED DESCRIPTION OF THE PREFERRED EMBODIMENTS

Figure 3:
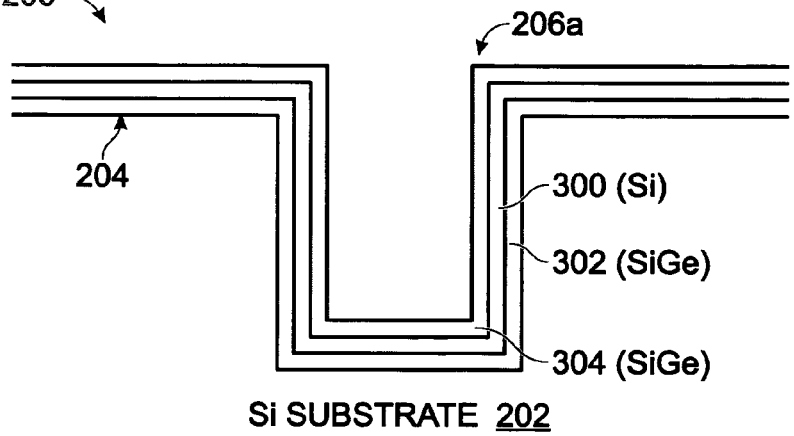
FIG. 3 is a cross-sectional view of an alternate aspect of the SiGe optical path structure of FIG. 2.

FIG. 2 is a cross-sectional view of the present invention SiGe optical path structure, normal to a Si substrate surface, for IR photodetection. The structure 200 comprises a Si substrate 202 with a surface 204. A Si feature 206 is normal with respect to the Si substrate surface 204. As shown, the feature 206 can be a via 206a, a trench 206b, or a pillar 206c. A surface-normal SiGe optical path 208, shown with double cross-hatched lines, overlies the Si feature 206.

The Si substrate surface (interface) 204 is formed in a first plane 210 parallel to the substrate surface 204. SiGe is epitaxially grown on the Si surface 204 and Si feature 206. The surface-normal SiGe optical path 208 is formed in a second plane 212, normal to the first plane 210. That is, the optical path 208 is normal to the substrate surface 204. Alternately stated, the feature 206 has an element or structure in a vertical plane that is perpendicular to the horizontal surface 204. Note, that the feature 206 may also include an element or structure, a trench bottom or pillar top for example, that is in a plane parallel to the first plane 210.

The optical path 208 has a thickness 214 in the range of 5 to 1000 nanometers (nm). The surface-normal SiGe optical path 208 has an optical path length 216 in the range of 0.1 to 10 microns, in the second plane 212.

In some aspects, the surface-normal SiGe optical path 208 includes a Ge concentration in the range from 5 to 100%. In other aspects, the surface-normal SiGe optical path 208 includes graded Ge concentration that increases with respect to the deposition thickness. For example, the surface-normal SiGe optical path 208 may have a 20% concentration of Ge at the Si substrate interface 204, a 30% concentration of Ge at a SiGe film top surface 220, and a thickness 214 of 400 nm.

FIG. 3 is a cross-sectional view of an alternate aspect of the SiGe optical path structure of FIG. 2. As in FIG. 2, a Si substrate 202 has a surface 204. The structure 200 further comprises at least one Si layer 300 overlying SiGe 302, so that the surface-normal SiGe optical path 208 includes a plurality of SiGe layers overlying Si. In this example, a via 206a is shown, with a SiGe first layer 302 and a second SiGe layer 304. Although an optical path 208 is shown with two SiGe layers (302/304) and a single interposing Si layer 300, the present invention is not limited to any particular number of SiGe/Si interfaces or layers. Further, the final SiGe layer (304 in this example) may fill the via 206a. Neither is the multilayer optical path structure limited to just a via surface-normal feature.

Figure 4:
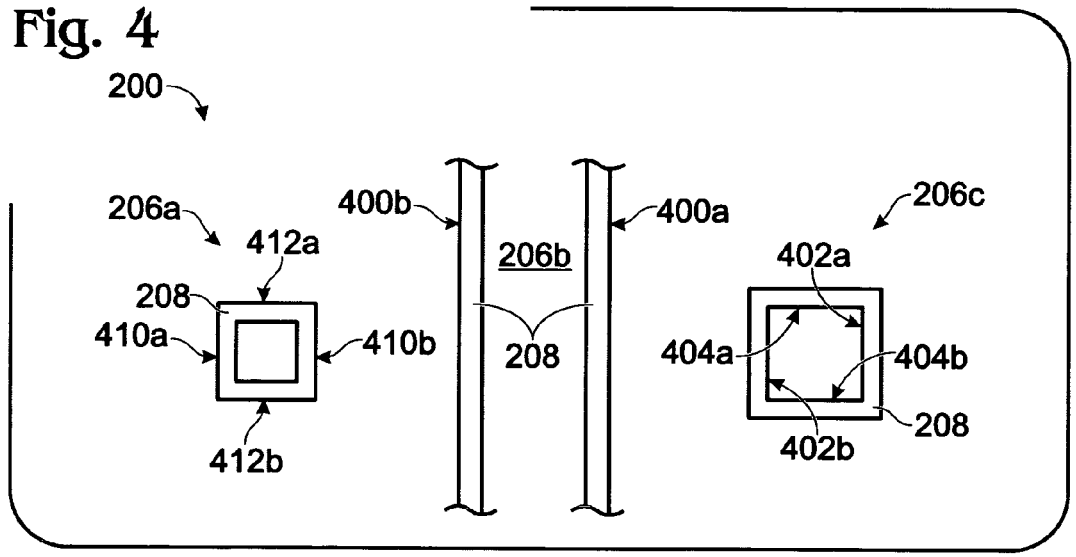
FIG. 4 is a plan view of the present invention optical path structure.

FIG. 4 is a plan view of the present invention optical path structure. Viewing both FIGS. 2 and 4, when the Si feature is a trench 206b, there are a pair of sidewalls 400a and 400b. In one aspect, the surface-normal SiGe optical path 208 is an optical path pair-structure adjacent the trench sidewalls 400a and 400b (see FIG. 4). Of course, the trench 206b typically has ends (not shown), which would constitute a second pair of sidewalls. Then, the optical path 208 might additionally include optical paths adjacent these trench-end sidewalls. In a different aspect, the surface-normal SiGe optical path 208 is a uni-structure that fills the trench 206b (see FIG. 2).

Returning to FIG. 4, when the Si feature is a pillar 206c, the pillar 206c has two pairs of sidewalls, a first pair 402a and 402b and a second pair 404a and 404b. The surface-normal SiGe optical path 208 is an optical path array-structure adjacent the corresponding pillar sidewall pairs 402a/402b and 404a/404b. In other aspects (not shown) the optical path structure is composed of SiGe layers adjacent a subset of the pillar sidewalls. Likewise, an optical path may be formed adjacent a pillar with rounded sidewalls.

In other aspects, the Si normal feature is via 206a with two pairs of sidewalls, a first pair of sidewalls 410a and 410b, and a second set of sidewalls 412a and 412b. Then, the surface-normal SiGe optical path 208 is an optical path array-structure adjacent the corresponding trench sidewall pairs 410a/410b and 412a/412b. Alternately, the surface-normal SiGe optical path is a uni-structure that fills the via (see FIG. 2). Likewise, an optical path may be formed adjacent a via with rounded sidewalls.

Figure 5:
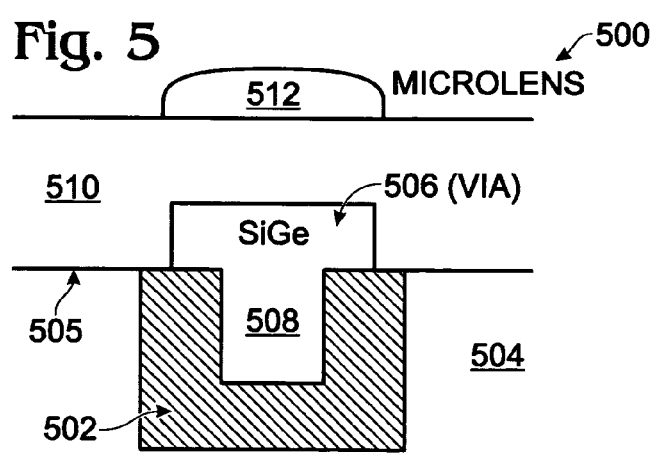
FIG. 5 is a cross-sectional view of the present invention IR photodetector.

FIG. 5 is a cross-sectional view of the present invention IR photodetector. The photodetector 500 comprises an interconnect 502 in electrical communication with a CMOS active region (not shown) formed in a Si substrate 504. The active region can be transistor source, drain, gate, or a diode region. The Si substrate 504 has a surface (interface) 505. A Si feature 506 is shown normal with respect to the Si substrate surface 505 in electrical communication with the interconnect 502. In this example, the feature 506 is a via. However, in other aspects the feature can be a trench or a pillar. A surface-normal SiGe optical path 508 overlies the Si feature 506.

In some aspects, an interlayer dielectric 510, such as SiO2, overlies the surface-normal SiGe optical path 508, and a microlens 512 overlies the interlayer dielectric 510 in optical communication with the surface-normal SiGe optical path 508. Additional details of the SiGe optical path are presented above in the explanations of FIGS. 2–4. Examples of CMOS active regions follow.

Functional Description

Figure 6:
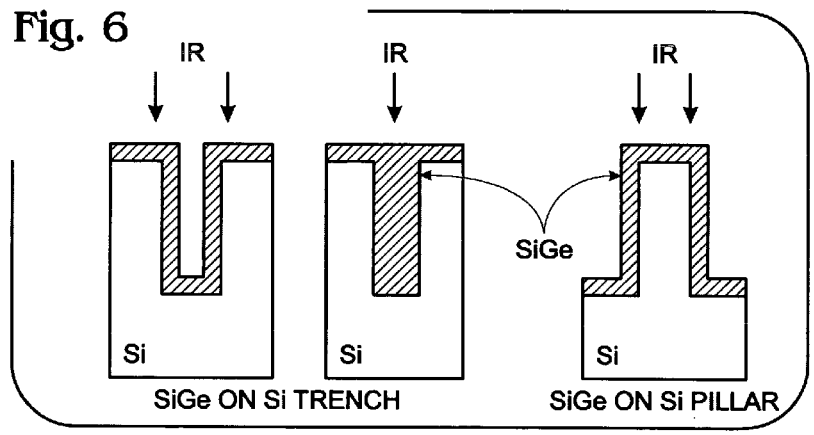
FIG. 6 is a cross-sectional view of FIG. 2, featuring an alternate aspect of the invention.
Figure 7:
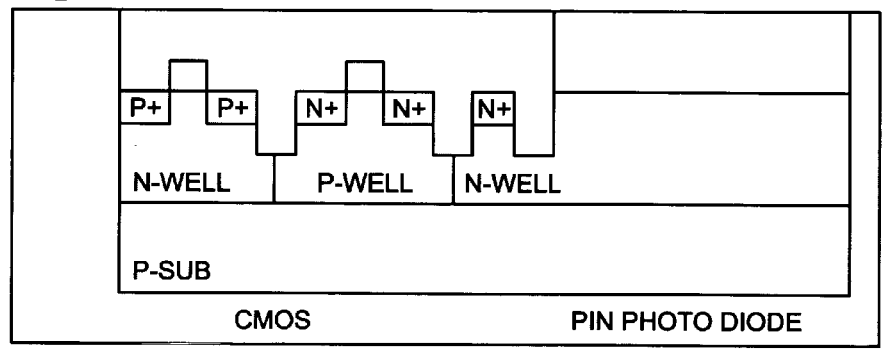
FIG. 7 is a cross-sectional view of a preliminary step in the formation of a PIN diode SiGe IR photodetector using a trench surface-normal feature.

FIG. 6 is a cross-sectional view of FIG. 2, featuring an alternate aspect of the invention. The present invention optical structure is created normal to a Si substrate surface. This can be accomplished using standard Si IC trench, pillar, or hole (via) processes. A SiGe (Ge concentration 5% to 100%) is epitaxially deposited on the Si. Two simple structures, a Si trench and Si pillar are shown. The SiGe is epitaxially deposited on Si to a thickness that is less than the critical thickness, so that no defects are generated. As an alternative to SiGe deposition with fixed concentration of Ge, a graded SiGe layer can be deposited. Another alternative is to form a quantum well SiGe structure that includes multiple Si and SiGe layers (SiGe/Si/SiGe/Si . . . ). SiGe can be used to either fill the trench or line the trench sidewalls FIG. 7 is a cross-sectional view of a preliminary step in the formation of a PIN diode SiGe IR photodetector using a trench surface-normal feature. This invention can be incorporated with various device types to fabricate high efficient IR photodetectors. These devices include, but are not limited to, PN diodes, PIN type diodes, heterojunction phototransistors, quantum well photodiodes, and Schottky diodes. Standard CMOS devices can be integrated with the IR detectors on a single Si wafer. As with any conventional CMOS procedure, an interlevel dielectric (ILD) deposition is performed. An N-well can be used as the n-layer of the PIN diode, or additional processes can be performed to form an n-layer.

Figure 8:
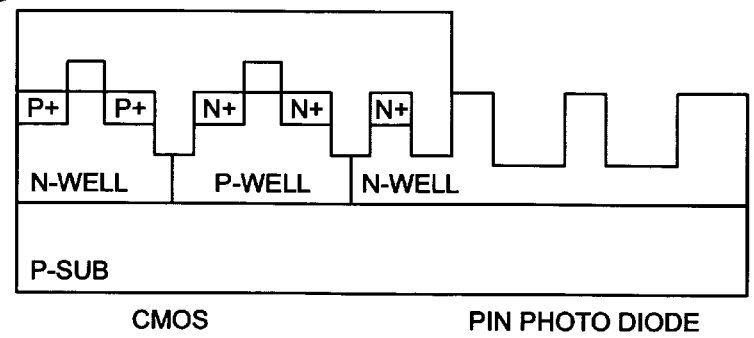
FIG. 8 is a cross-sectional view of the photodetector of FIG. 7 following a photoresist process to form trenches in the Si substrate (N-well).

FIG. 8 is a cross-sectional view of the photodetector of FIG. 7 following a photoresist process to form trenches in the Si substrate (N-well). The trenches have a depth in the range of 0.1 to 10 microns.

Figure 9:
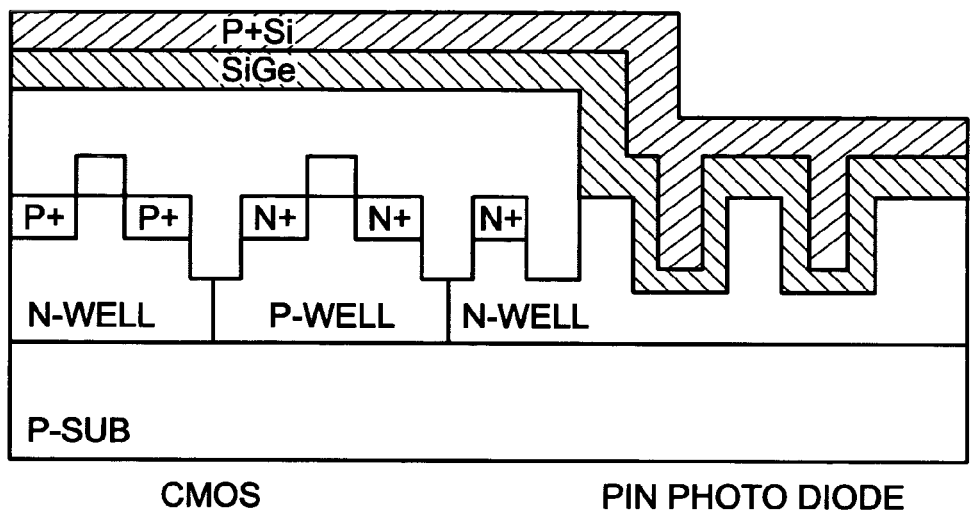
FIG. 9 is a cross-sectional view of the photodetector of FIG. 8 following the epitaxial growth of SiGe on photodiode area.

FIG. 9 is a cross-sectional view of the photodetector of FIG. 8 following the epitaxial growth of SiGe on photodiode area. SiGe is non-doped to form a SiGe intrinsic layer. Note, a SiGe deposition on top of ILD becomes polycrystalline. The SiGe thickness is 0.05 to 0.5 microns. Next, Si is epitaxially grown and doped to be P+. The P+doping can be an result of in-situ doping during Si growth, or ion implantation after Si growth. The P+thickness is in the range of 0.05 to 1 micron.

Figure 10:
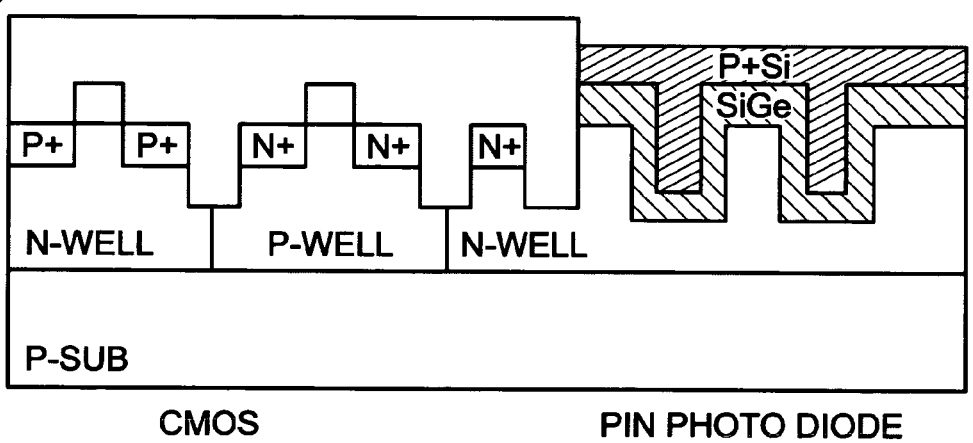
FIG. 10 is a cross-sectional view of the photodetector of FIG. 9 following a photoresist and etching of the P+Si and SiGe layers.

FIG. 10 is a cross-sectional view of the photodetector of FIG. 9 following a photoresist and etching of the P+Si and SiGe layers.

Figure 11:
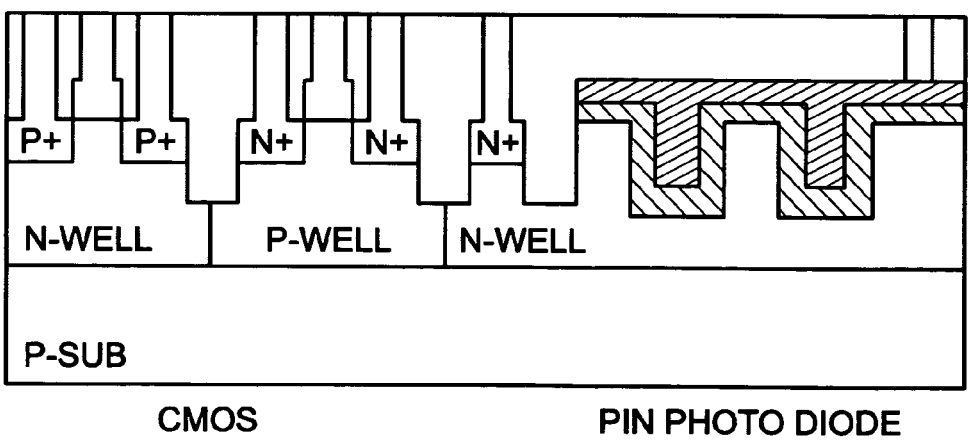
FIG. 11 is a cross-sectional view of the photodetector of FIG. 10 following an ILD deposition and the formation of interlevel contact to the CMOS transistors and the present invention IR photodiode.

FIG. 11 is a cross-sectional view of the photodetector of FIG. 10 following an ILD deposition and the formation of interlevel contact to the CMOS transistors and the present invention IR photodiode.

Figure 12:
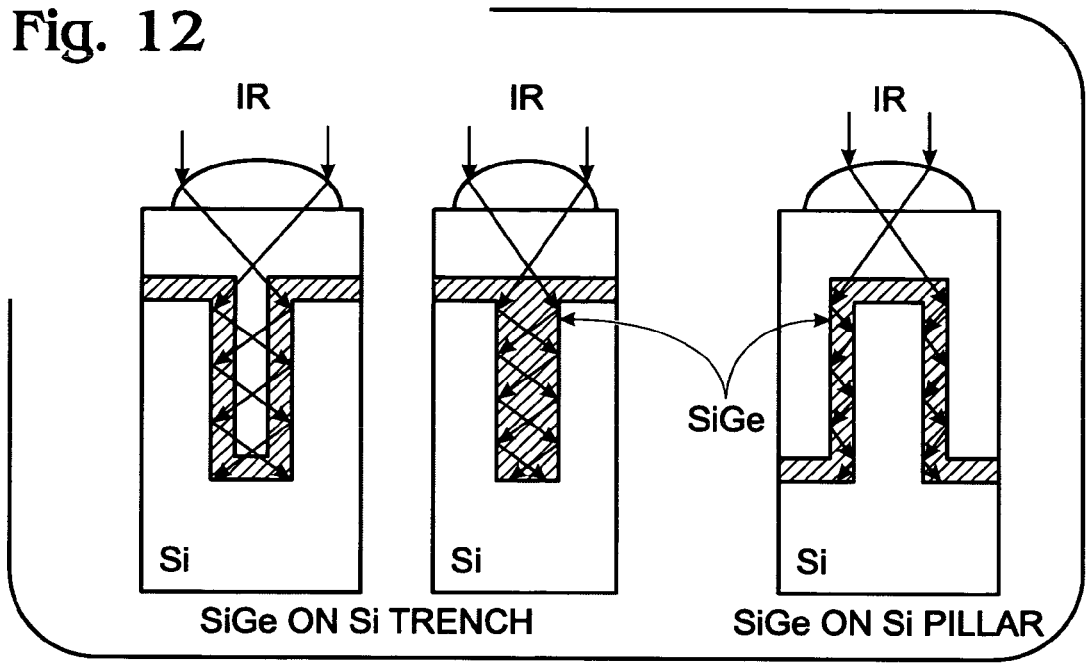
FIG. 12 is a cross-sectional view of SiGe optical path structure of FIG. 6 with the addition of a microlens.

FIG. 12 is a cross-sectional view of SiGe optical path structure of FIG. 6 with the addition of a microlens.

Figure 13:
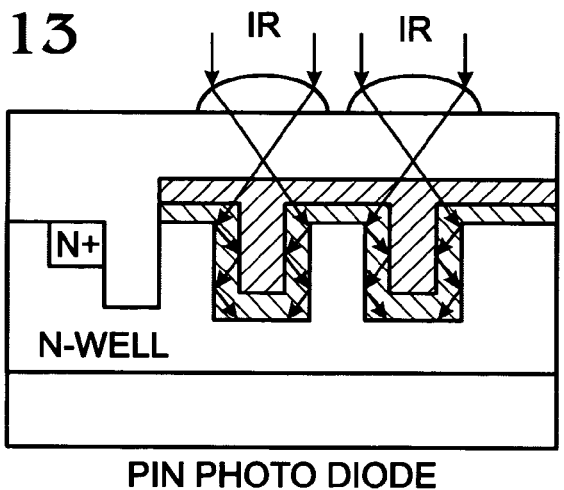
FIG. 13 is a cross-sectional view of the photodetector of FIG. 11 with the addition of a microlens.

FIG. 13 is a cross-sectional view of the photodetector of FIG. 11 with the addition of a microlens. IR detectors with SiGe vertical sidewalls have improved quantum efficiency, but the effective area for the IR detection (the optical path length) depends on the surface-normal feature (trench/via/pillar) layout. Another way to improve the area efficiency is to add a microlens, to focus the incident IR into the trench, as shown in FIGS. 12 and 13. The IR reflection at the Si/SiGe interface can also improve the light absorption. Note the reflection of light at the Si/SiGe interfaces. Also note that in FIG. 13 that each trench has its own microlens to focus the light and maximize the IR absorption in SiGe.

Figure 14:
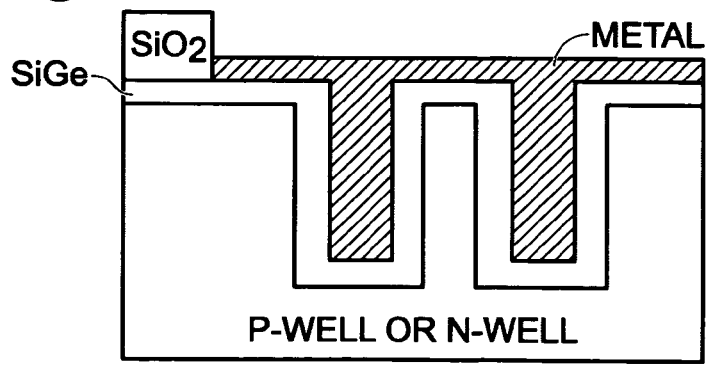
FIG. 14 is a cross-sectional view of a Schottky diode IR photodetector using a surface-normal SiGe optical path.

FIG. 14 is a cross-sectional view of a Schottky diode IR photodetector using a surface-normal SiGe optical path. The diode can be formed in either a P-well or an N-well. The metal deposition can be a material such as Pt, Ir, or Pt/Ir.

Figure 15:
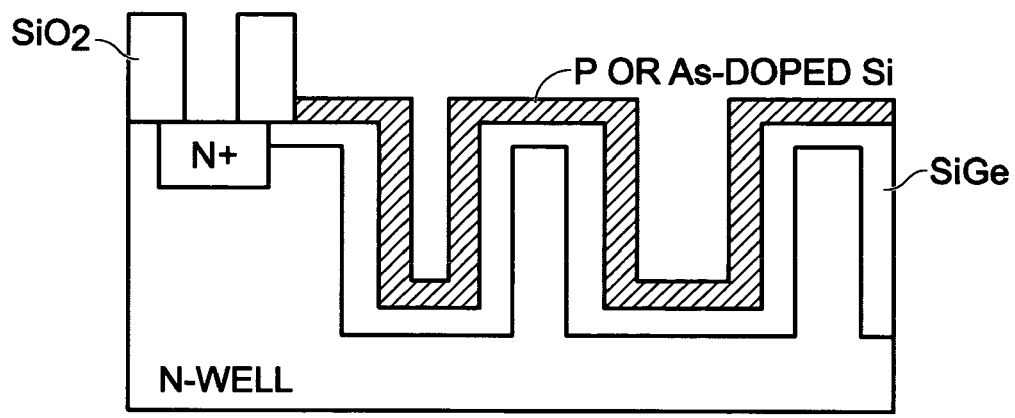
FIG. 15 is a cross-sectional view of an npn bipolar IR detector using a surface-normal SiGe optical path

FIG. 15 is a cross-sectional view of an npn bipolar IR detector using a surface-normal SiGe optical path. As shown, the transistor is formed in an N-well. The SiGe is p-type doped with boron either by in-situ doping or by ion implantation after deposition. The overlying Si layer is in-situ P-doped or As-doped n-type Si. Alternately, intrinsic Si can be implanted with dopants of As or P to form n-type Si layer.

Figure 16:
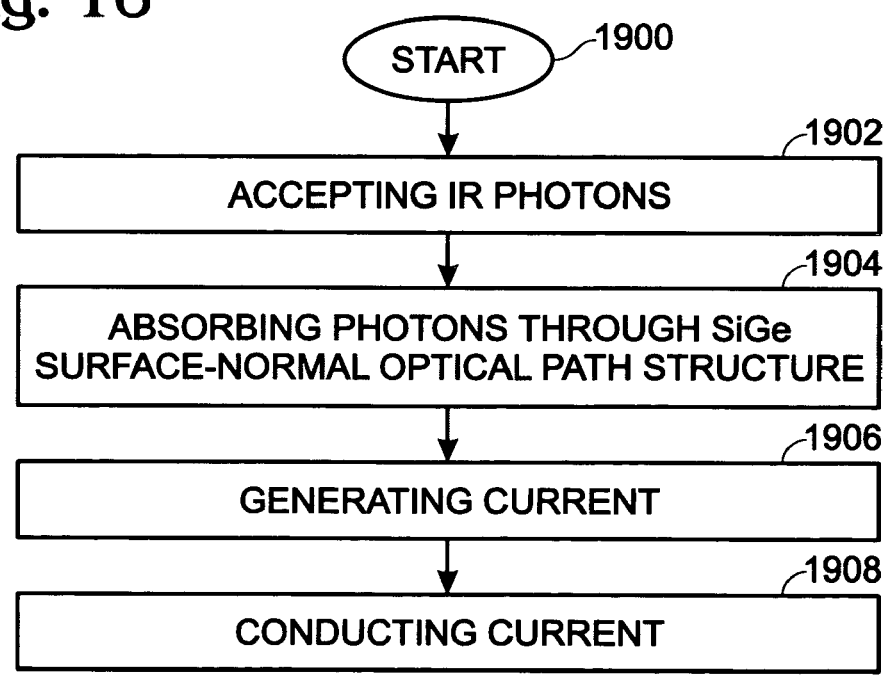
FIG. 16 is a flowchart illustrating the present invention method for photodetecting IR energy using a SiGe surface-normal optical path structure.
Figure 17:
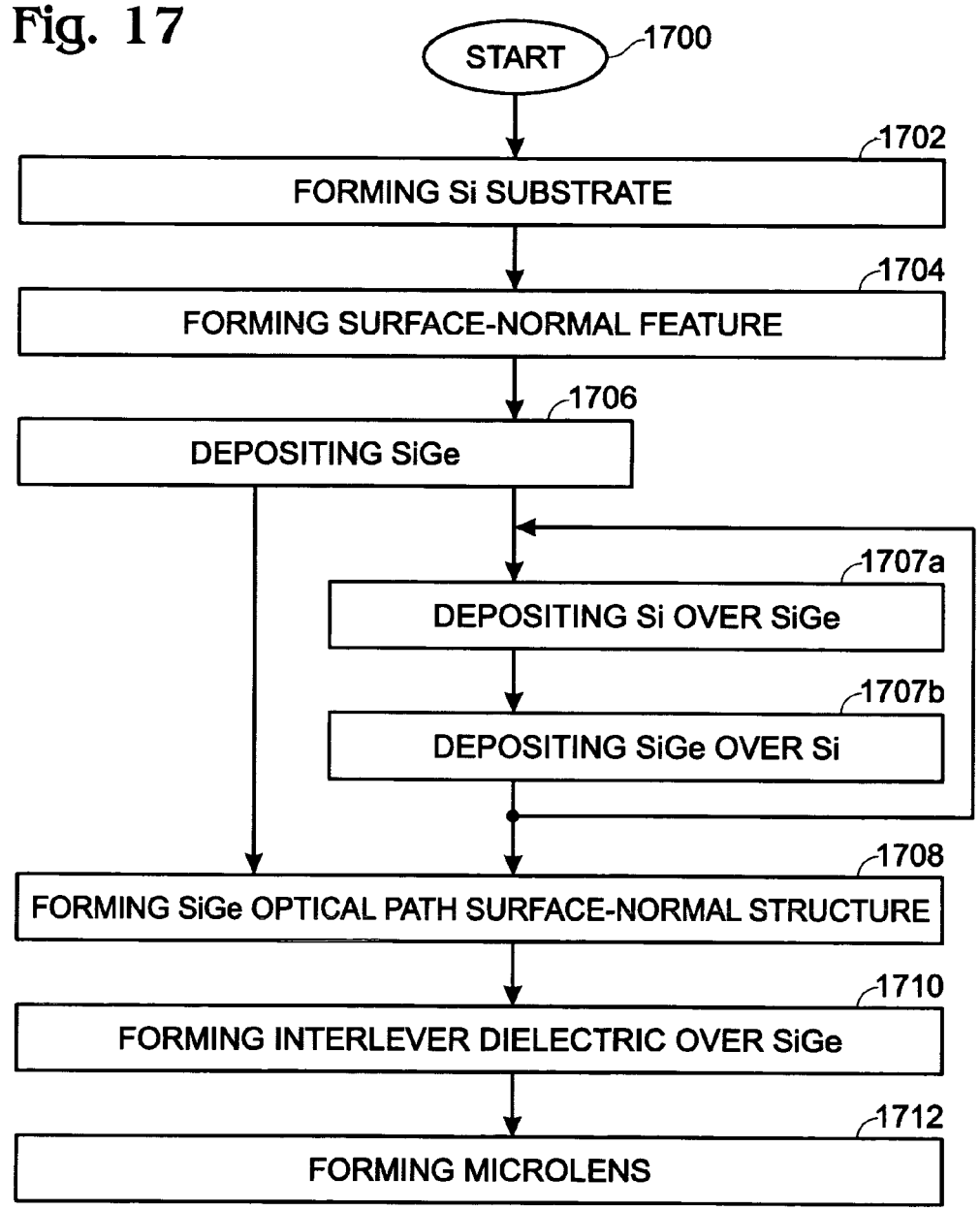
FIG. 17 is a flowchart illustrating the present invention method for forming a SiGe optical path structure, normal to a Si substrate surface, for IR photodetection.

FIG. 17 is a flowchart illustrating the present invention method for forming a SiGe optical path structure, normal to a Si substrate surface, for IR photodetection. Although the method (and the method describing FIGS. 18 and 16, below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1700.

Step 1702 forms a Si substrate with a surface. Step 1704 forms a Si feature, such as a via, trench, or pillar, normal with respect to the Si substrate surface. Note, the invention is not necessarily limited to just these three example features. Step 1706 deposits SiGe overlying the Si normal feature (and Si substrate surface), to a thickness in the range of 5 to 1000 nanometers (nm). Step 1708 forms a SiGe optical path normal structure having an optical path length in the range of 0.1 to 10 microns. As used herein, a normal structure is intended to describe a Si substrate surface-normal structure. Alternately expressed, the surface-normal features have a length of 0.1 to 10 microns.

Typically, Step 1706 deposits SiGe with a Ge concentration in the range from 5 to 100%. In some aspects, SiGe is deposited with a graded Ge concentration that increases with respect to the deposition thickness. For example, the SiGe may have a 20% concentration of Ge at the Si substrate interface, a 30% concentration of Ge at a SiGe film top surface, and a thickness of 400 nm.

Other aspects of the method include additional steps. Step 1707*a* deposits a Si layer overlying the SiGe. Step 1707*b* deposits SiGe overlying the Si layer. Then, forming a SiGe normal optical path structure in Step 1708 includes forming a normal optical path structure with a plurality of SiGe layers. Note, Steps 1707*a* and 1707*b* may be iterated a number of times to build up a plurality of SiGe/Si layers.

For example, if Step 1704 forms a trench with a pair of sidewalls, Step 1706 may deposit SiGe sidewalls overlying the trench sidewalls. Then, Step 1708 forms a SiGe optical path pair-structure. Alternately, Step 1706 fills the trench with SiGe and Step 1708 forms a SiGe optical path uni-structure.

In another example, Step 1704 forms a pillar with two pairs of sidewalls and Step 1706 deposits SiGe sidewalls overlying the two pairs of pillar sidewalls. Then, Step 1708 forms an optical path array-structure adjacent the corresponding pillar sidewall pairs. Alternately, the SiGe optical path structure can be formed on a subset of the four pillar sidewalls.

In another example, Step 1704 forms a via with two pairs of sidewalls and Step 1706 deposits SiGe sidewalls overlying the two pairs of via sidewalls. Then, Step 1708 forms an optical path array-structure adjacent the corresponding via sidewall pairs. As above, the optical path structure can be formed on a subset of the via sidewalls. Alternately, Step 1706 fills the via with SiGe and Step 1708 forms an optical path uni-structure.

Other aspects of the method include further steps. Step 1710 forms an interlayer dielectric overlying the SiGe optical path normal structure. Step 1712 forms a microlens overlying the interlayer dielectric in optical communication with the SiGe optical path normal structure.

Figure 18:
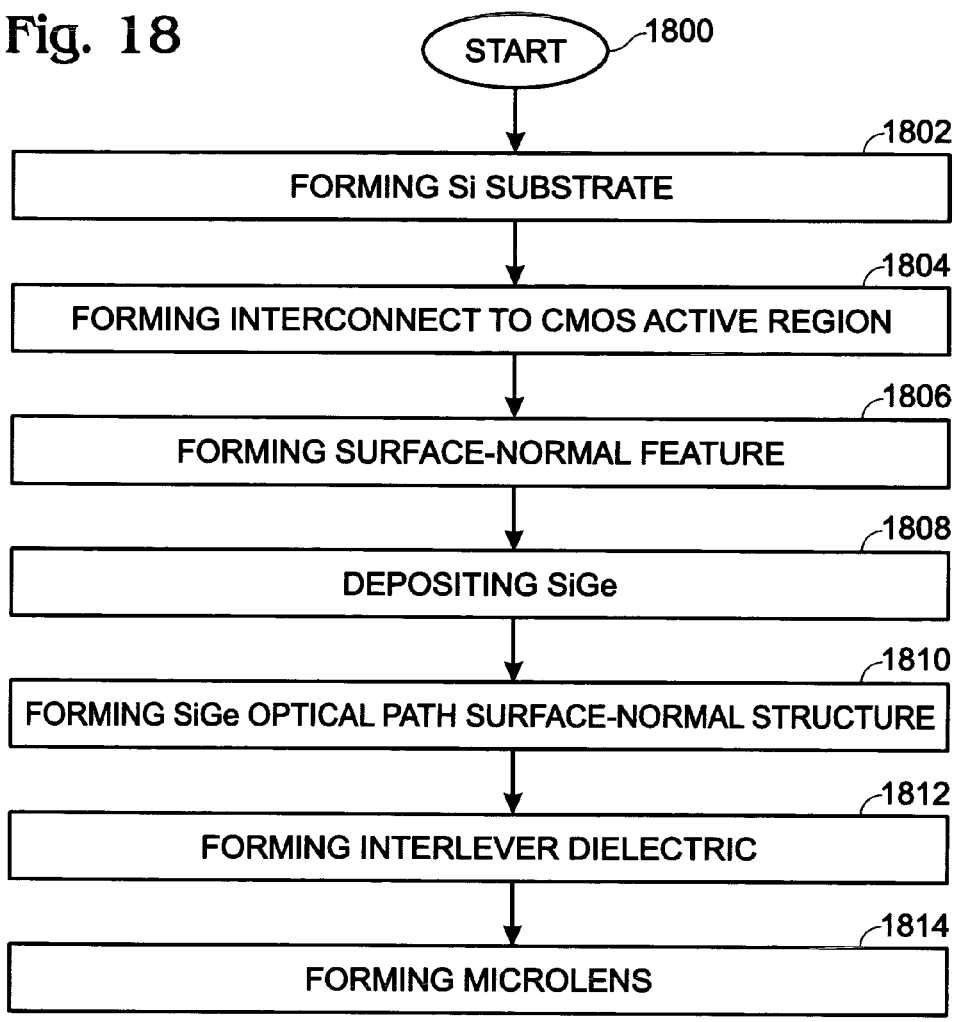
FIG. 18 is a flowchart illustrating the present invention method for forming an IR photodetector with a SiGe optical path structure, normal to a Si substrate surface.

FIG. 18 is a flowchart illustrating the present invention method for forming an IR photodetector with a SiGe optical path structure, normal to a Si substrate surface. The method starts at Step 1800. Step 1802 forms a Si substrate with a surface. Step 1804 forms an interconnect in electrical communication with a CMOS active region such as a source, drain, gate, or a diode region. Examples of such active regions are presented in FIGS. 5 through 15. Step 1806 forms a Si feature, normal with respect to the Si substrate surface. Step 1808 deposits SiGe overlying the Si normal feature. Step 1810 forms a SiGe optical path normal structure in electrical communication with the CMOS active region, through the interconnect. Step 1812 forms an interlayer dielectric overlying the SiGe optical path normal structure. Step 1814 forms a microlens overlying the interlayer dielectric in optical communication with the SiGe optical path normal structure. Details of the SiGe optical path structure are presented in the explanation of FIG. 17, above.

FIG. 16 is a flowchart illustrating the present invention method for photodetecting IR energy using a SiGe surface-normal optical path structure. The method starts at Step 1900. Step 1902 accepts IR photons having a trajectory normal to a Si substrate surface. Step 1904 absorbs the IR photons through a SiGe surface-normal optical path structure. Step 1906 generates a current in response to absorbing the IR photons. Step 1908 conducts the current into a CMOS active region.

In some aspects, accepting IR photons having a trajectory normal to a Si substrate surface in Step 1902 includes accepting IR photons having a wavelength in the range of 0.8 to 1.6 microns.

In other aspects, absorbing the IR photons through a SiGe surface-normal optical path structure in Step 1904 includes absorbing 1.1 micron wavelength IR photons with an efficiency of approximately 7%, responsive to an optical path structure length of 10 microns. In a different aspect Step 1904 absorbs 1.1 micron wavelength IR photons with an efficiency in the range of 0.07 to 7% efficiency, responsive to an optical path structure length in the range of 0.1 to 10 microns.

A surface-normal SiGe optical path structure and corresponding fabrication process have been presented. Simple surface-normal features such as vias, trenches, and pillars have been used to illustrate the invention. However, the invention may also be applied to more complicated features. Likewise, although SiGe films have been described, the invention is not necessarily limited to a particular light-absorbing film or a particular wavelength of light. Other variations and embodiments of the invention will occur to those skilled in the art.

We claim:

1. A method for forming a silicon-germanium (SiGe) optical path structure, normal to a silicon (Si) substrate surface, for infrared (IR) photodetection, the method comprising:

forming a Si substrate with a surface;
forming a Si feature, normal with respect to the Si substrate surface;
depositing SiGe overlying the Si normal feature;
forming a SiGe optical path normal structure;
wherein forming a Si feature, normal with respect to the Si substrate surface includes forming a pillar with two pairs of sidewalls;

wherein depositing SiGe overlying the Si normal feature includes depositing SiGe sidewalls overlying the two pairs of pillar sidewalls; and, wherein forming a SiGe optical path normal structure includes forming an optical path array-structure adjacent the corresponding pillar sidewall pairs.

2. The method of claim 1 wherein depositing SiGe overlying the Si normal feature includes depositing SiGe to a thickness in the range of 5 to 1000 nanometers (nm).

3. The method of claim 1 wherein forming a SiGe optical path normal structure includes forming a SiGe normal structure having an optical path length in the range of 0.1 to 10 microns.

4. The method of claim 1 wherein depositing SiGe overlying the Si normal feature includes depositing SiGe with a Ge concentration in the range from 5 to 100%.

5. The method of claim 1 wherein depositing SiGe overlying the Si normal feature includes depositing SiGe with a graded Ge concentration that increases with the distance from the Si normal feature.

6. The method of claim 5 wherein the SiGe has a 20% concentration of Ge at the Si substrate interface, a 30% concentration of Ge at a SiGe film top surface, and a thickness of 400 nm.

7. The method of claim 1 further comprising:
depositing a Si layer overlying the SiGe;
depositing SiGe overlying the Si layer; and,
wherein forming a SiGe normal optical path structure includes forming a normal optical path structure with a plurality of SiGe layers.

8. The method of claim 1 further comprising:
forming an interlayer dielectric overlying the SiGe optical path normal structure; and,
forming a microlens overlying the interlayer dielectric in optical communication with the SiGe optical path normal structure.

9. A method for forming an infrared (IR) photodetector with a silicon-germanium (SiGe) optical path structure, normal to a silicon (Si) substrate surface, the method comprising:

forming a Si substrate with a surface;
forming an interconnect in electrical communication with a CMOS active region selected from the group consisting of a source, drain, gate, and a diode region;
forming a Si feature, normal with respect to the Si substrate surface;
depositing SiGe overlying the Si normal feature;
forming a SiGe optical path normal structure in electrical communication with the active region, through the interconnect;
forming an interlayer dielectric overlying the SiGe optical path normal structure; and,
forming a microlens overlying the interlayer dielectric in optical communication with the SiGe optical path normal structure.

10. A method for photodetecting infrared (IR) energy using a silicon-germanium (SiGe) surface-normal optical path structure, the method comprising:

accepting IR photons having a trajectory normal to a silicon (Si) substrate surface;
absorbing the IR photons though a SiGe surface-normal optical path structure;
generating a current in response to absorbing the IR photons; and,
conducting the current into a CMOS active region.

11. The method of claim 10 wherein accepting IR photons having a trajectory normal to a Si substrate surface includes accepting IR photons having a wavelength in the range of 0.8 to 1.6 microns.

12. The method of claim 10 wherein absorbing the IR photons through a SiGe surface-normal optical path structure includes absorbing 1.1 micron wavelength IR photons with an efficiency of approximately 7%, responsive to an optical path structure length of 10 microns.

13. The method of claim 10 wherein absorbing the IR photons through a SiGe surface-normal optical path structure includes absorbing 1.1 micron wavelength IR photons with an efficiency in the range of 0.07 to 7% efficiency, responsive to an optical path structure length in the range of 0.1 to 10 microns.

14. A silicon-germanium (SiGe) optical path structure, normal to a silicon (Si) substrate surface, for infrared (IR) photodetection, the structure comprising:
a Si substrate with a surface;
a Si feature, normal with respect to the Si substrate surface;
a surface-normal SiGe optical path overlying the Si feature;
wherein the Si feature is a pillar with two pairs of sidewalls; and,
wherein the surface-normal SiGe optical path is an optical path array-structure adjacent the corresponding pillar sidewall pairs.

15. The structure of claim 14 wherein the Si substrate surface is formed in a first plane; and,
wherein the surface-normal SiGe optical path is formed in a second plane, normal to the first plane, with a thickness in the range of 5 to 1000 nanometers (nm).

16. The structure of claim 15 wherein the surface-normal SiGe optical path has an optical path length in the range of 0.1 to 10 microns, in the second plane.

17. The structure of claim 14 wherein the surface-normal SiGe optical path includes a Ge concentration in the range from 5 to 100%.

18. The structure of claim 14 wherein the surface-normal SiGe optical path includes graded Ge concentration that increases with the distance from the Si feature.

19. The structure of claim 18 wherein the surface-normal SiGe optical path has a 20% concentration of Ge at the Si substrate interface, a 30% concentration of Ge at a SiGe film top surface, and a thickness of 400 nm.

20. The structure of claim 14 further comprising:
at least one Si layer overlying SiGe; and,
wherein the surface-normal SiGe optical path includes a plurality of SiGe layers overlying Si.

21. An infrared (IR) photodetector comprising:
a CMOS active region formed in a silicon (Si) substrate with a surface, the active region selected from the group consisting of a transistor source, drain, gate, and a diode region;
an interconnect in electrical communication with the active region
a Si feature, normal with respect to the Si substrate surface, and in electrical communication with the interconnect;
a surface-normal SiGe optical path overlying the Si feature;
an interlayer dielectric overlying the surface-normal SiGe optical path; and,
a microlens overlying the interlayer dielectric in optical communication with the surface-normal SiGe optical path.

22. A method for forming a silicon-germanium (SiGe) optical path structure, normal to a silicon (Si) substrate surface, for infrared (IR) photodetection, the method comprising:
forming a Si substrate with a surface;
forming a Si feature, normal with respect to the Si substrate surface;
depositing SiGe overlying the Si normal feature;
forming a SiGe optical path normal structure;
forming an interlayer dielectric overlying the SiGe optical path normal structure; and,
forming a microlens overlying the interlayer dielectric in optical communication with the SiGe optical path normal structure.

* * * * *